United States Patent [19]

Tomiya

[11] Patent Number: 5,028,740

[45] Date of Patent: Jul. 2, 1991

[54] HOLLOW HOUSING CASE FOR SHEATHING AND ELECTROMAGNETICALLY SHIELDING ELECTRICAL APPARATUS

[75] Inventor: Chikamasa Tomiya, Tokyo, Japan

[73] Assignee: Iwastu Electric Co., Inc., Tokyo, Japan

[21] Appl. No.: 375,254

[22] Filed: Jul. 3, 1989

[30] Foreign Application Priority Data

Sep. 3, 1988 [JP] Japan .......................... 63-115595[U]

[51] Int. Cl.⁵ .......................... H05K 9/00; H05K 5/04; B65D 8/22
[52] U.S. Cl. ............................. 174/35 R; 138/160; 138/170; 220/692; 220/693
[58] Field of Search ............ 174/35 R, 35 MS, 102 R, 174/36; 138/128, 151, 152, 156, 159, 160, 170, 171; 220/75, 77, 689, 692, 693; 156/54; 29/525.2; 413/74, 75, 77

[56] References Cited

U.S. PATENT DOCUMENTS

| | | | |
|---|---|---|---|
| 205,238 | 6/1878 | Brooks | 138/170 |
| 406,332 | 7/1889 | Bayles | 138/152 |
| 1,227,596 | 5/1917 | Eberhart | 220/75 X |
| 2,156,028 | 4/1939 | Punte | 138/156 X |
| 3,439,111 | 4/1969 | Miracle et al. | 174/36 X |
| 3,618,817 | 11/1971 | Troughton | 220/75 X |

FOREIGN PATENT DOCUMENTS

| | | | |
|---|---|---|---|
| 502625 | 5/1951 | Belgium | 174/102 R |
| 302879 | 11/1932 | Italy | 138/128 |

*Primary Examiner*—Laramie E. Askin
*Attorney, Agent, or Firm*—Paul & Paul

[57] ABSTRACT

A hollow housing case of an electriclly conducting plate which has one insulating surface includes a connecting part to connect together electrically both ends of the plate. The connecting part is a bent portion which is formed by bending at least one end of the plate and enabling the non-insulating surfaces at both ends to face and contact with each other surely. Further, the hollow housing case comprises a fastening member for finally fastening together both ends of the plate. By the fastening member, a hollow housing case of any size can be fabricated easily, without the process of pressing.

4 Claims, 2 Drawing Sheets

HOLLOW HOUSING CASE FOR SHEATHING AND ELECTROMAGNETICALLY SHIELDING ELECTRICAL APPARATUS

BACKGROUND OF THE INVENTION

1. Field of the Invention

The present invention relates to a hollow housing case for sheathing and electromagnetically shielding electric apparatus.

In general, a hollow housing case which can be fabricated easily is used in order to sheathe the body of an electric apparatus and to shield the electric apparatus against the influence of electromagnetic waves, electrostatic noise, the noise from a power supply, and the like.

2. Description of the Related Art

A hollow housing case is generally fabricated by the following procedures. First, a sheet of electrically conducting plate, such as metal plate, is deformed into a hollow form. Second, both ends of the hollow conducting plate are connected together electrically by means of spot welding or the like so that there is no electrical discontinuity in the hollow conducting plate. Third, the outer surface of the plate is sheated by means of painting, coating with resin, or the like, in order to electrically protect the electric apparatus which are to be housed in the hollow case from external circumstances, and finally the fabrication of the hollow housing case is finished. Due to the above sheating, the electric apparatus is securely insulated from the outside and also the outer surface of the hollow housing case looks attractive. On the other hand, it is necessary to electrically connect the inner surface of the hollow housing case to the body of the electric apparatus, in order to shield the apparatus. Therefore, during the process of the sheating, the inner surface of the hollow case must be masked with tape or the like, so that painting material, resin, or the like do not adhere to the inner surface.

In order to avoid the problem of masking and reduce the time for fabrication of the hollow case, in the prior art, a conducting plate having one previously insulated surface outside and the opposite non-insulated surface inside has been prepared. In this case, however, both ends of the conducting plate cannot be connected together by means of spot welding or the like because the insulating surface at one end and the non-insulating surface at the other end contact with each other by simply overlapping both ends. Therefore, a piece of connecting plate to electrically connect together the non-insulating surfaces at both ends is arranged, so that one surface of the connecting plate contacts with both of the non-insulating surfaces. In this case, because the area of contact of the surfaces is relatively wide, it is difficult to connect together the non-insulating surfaces by means of spot welding. Accordingly, a piece of connecting plate and both ends of the conducting plate are connected together by pressing them at the same time with a press or the like. As mentioned above, in the prior art, the hollow housing case comprising the conducting plate which has one insulating surface and the opposite non-insulating surface is fabricated efficiently by means of pressing, without the process of masking.

However, the above pressing has the following disadvantage; namely, if the hollow case is relatively long along its axis, and similarly if the opening in the hollow case is relatively narrow in width, i.e., the length in the direction of pressing, it is difficult to fix the bed plate of the press in the desired position inside the hollow case. In this case, because the connecting plate and both ends of the conducting plate cannot be pressed with sufficiently large pressure, they might not be connected together securely. Consequently, the allowable dimensions of the hollow case in the process of pressing are limited. Further, because the press is generally expensive, the cost of fabrication may become rather high if a large number of the hollow cases are not to be fabricated.

SUMMARY OF THE INVENTION

Accordingly, an object of the present invention is to provide a hollow housing case whose dimensions can be freely selected and which can be fabricated easily without the process of pressing.

To attain the above, object the hollow housing case according to the present invention, comprising a sheet of electrically conducting plate which has one insulating surface and the opposite non-insulating surface, is provided. The above hollow case includes a connecting part which enables the non-insulating surfaces to face and contact with each other, in the given position of the above conducting plate, e.g., at both ends thereof. Further, the above connecting part is a bent portion which is formed at one end of the conducting plate. Here, one end thereof is bent back so that the insulating surface is arranged inside the bent portion. If the other end is set on the bent portion, the non-insulating surfaces at both ends contact with each other easily. Further, the hollow case comprises a fastening member for fastening together the other end and the bent portion. By the above fastening member, they are connected together securely without the process of pressing.

BRIEF DESCRIPTION OF THE DRAWINGS

The above object and features of the present invention will be more apparent from the following description of the preferred embodiments with reference to the accompanying drawings, wherein.

DESCRIPTION OF THE PREFERRED EMBODIMENTS

Before describing the embodiments of the present invention, the related art and the disadvantage therein will be described with reference to the related figures.

Figure 1:
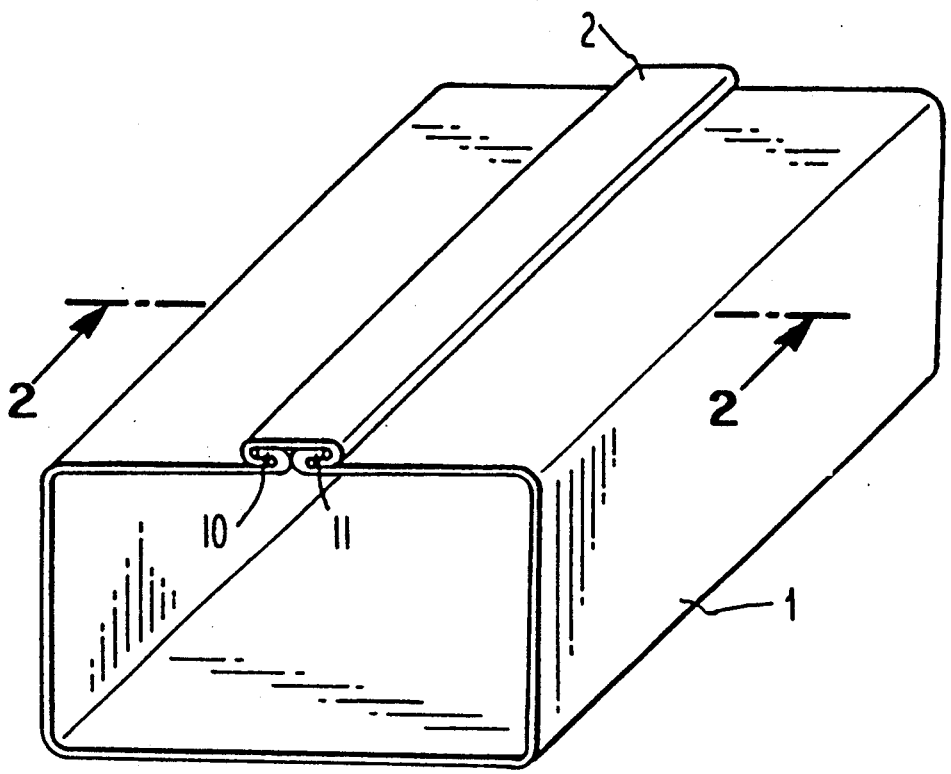
FIG. 1 is a perspective view showing a prior art hollow housing case.
Figure 2:
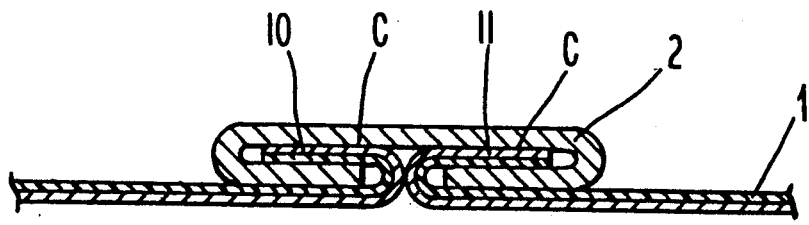
FIG. 2 is an enlarged sectional view taken along lines 2—2 of FIG. 1.

FIG. 1 is a perspective view showing a prior art hollow housing case. FIG. 2 is an enlarged sectional view taken along lines 2—2 of FIG. 1 to show the main part of a prior art hollow housing case.

The following explanation will be given by referring to both FIG. 1 and FIG. 2. In this case, the rectangular hollow housing case is selected as an example of the hollow housing case. In FIGS. 1 and 2, the hollow housing case comprises a sheet of electrically conducting plate 1, only one surface of which is previously insulated with painting material, resin, or the like. Further, the hollow case comprises a pair of engaging portions which are formed at both ends 10, 11 of a sheet of electrically conducting plate 1. In this case, both ends 10, 11 are bent up so that non-insulating surfaces C (FIG. 2) of both ends 10, 11 are positioned at the upper side of the engaging portions. Further, the hollow case comprises a piece of connecting plate 2 which is electrically conductive and is engaged with the engaging portions so as to face and contact with the non-insulating surfaces C respectively. In general, by pressing a piece of connecting plate 2 and the engaging portions with a press or the like, they are connected together securely.

According to the above prior art, the hollow case can be fabricated out of a conducting plate which has one insulating surface. Accordingly, the process of masking is unnecessary and the time for fabrication of the hollow case may be reduced. In this case, however, the allowable dimensions of the hollow case are limited mainly by the size of the press. Consequently, it is difficult to fabricate various types of hollow cases with a normal size press, at the request of users.

Figure 3:
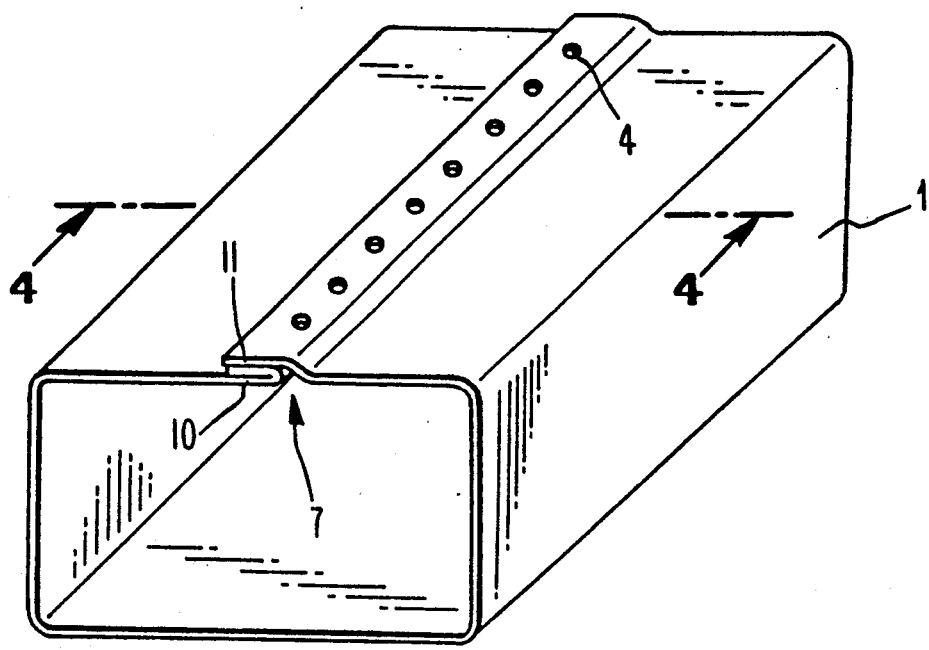
FIG. 3 is a perspective view showing an embodiment of the present invention.
Figure 4:
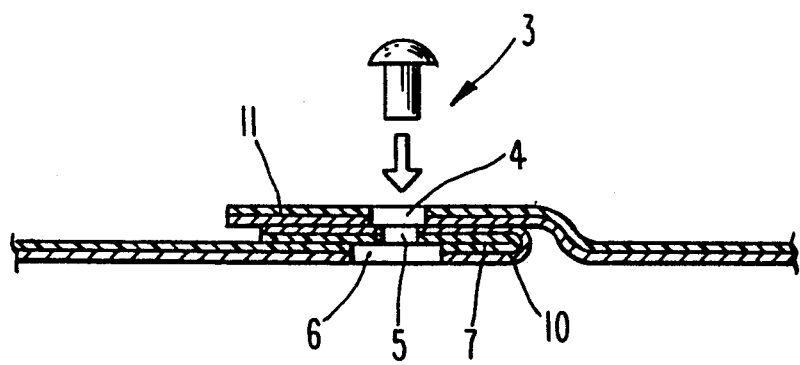
FIG. 4 is an enlarged sectional view taken along lines 4—4 of FIG. 3 before staking.

FIG. 3 is a perspective view showing an embodiment of the present invention. FIG. 4 is an enlarged sectional view taken along lines 4—4 of FIG. 3 to show the main part of an embodiment of the present invention before staking. Further, in FIG. 4, a fastening member 3 is to be inserted as indicated by an arrow.

The following explanation will be given by referring to both FIG. 3 and FIG. 4. From now on, the rectangular hollow case will be illustrated as the preferred embodiments. In FIGS. 3 and 4, the hollow housing case comprises the same conducting plate 1 as in FIGS. 1 and 2. Further, the hollow housing case includes a connecting part which has a bent portion 7 at one end 10 of the conducting plate 1, the bent portion including an innermost section and an outermost section. The above bent portion 7 is formed with one end 10 being bent back so that the insulating surface of the conducting plate 1 is arranged inside the bent portion 7 and also so that the non-insulating surface is arranged at the bent side of the bent portion. Further, the bent portion is deformed so that the bent non-insulating surface becomes flat. On the other hand, the other end 11 of the conducting plate 1 has a stepped shape, according to the thickness of the bent portion 7. If the stepped shape is set on the outermost section of the bent portion 7, non-insulating surfaces of both ends 10, 11 face and contact with each other securely in the desired position. Further, a fastening member 3 (FIG. 4) is realized with at least one staking unit, such as a rivet or eyelet, preferably. In FIG. 4, a plurality of staking units are provided. Further, corresponding to each of the staking units, three different kinds of holes are formed in the other end 11 and the bent portion 7. The above three kinds of holes are referred to as an inserting hole 4 in the other end 11, and a guide hole 5 (FIG. 4) and a staking hole 6 (FIG. 4) in the bent portion 7, respectively. The inserting hole 4, the guide hole 5 and the staking hole 6 are preferably arranged concentrically, so that they allow staking units to pass through easily.

Figure 5:
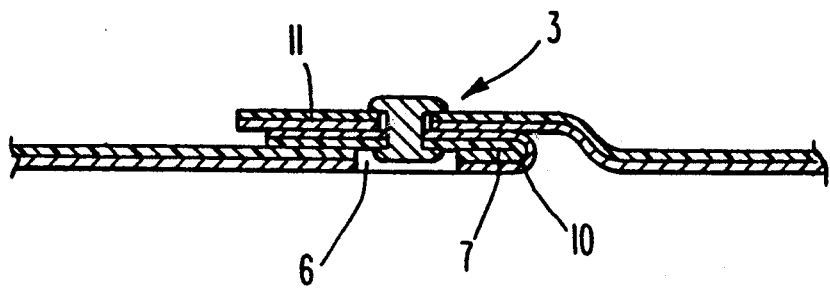
FIG. 5 is an enlarged sectional view similar to FIG. 3 after staking.

FIG. 5 is an enlarged sectional view similar to FIG. 3 to show the main part of an embodiment of the present invention after staking.

The following procedure for fastening together the other end 11 and the bent part 7 will be explained successively by referring to aforementioned FIG. 4 and FIG. 5. First, one staking unit, e.g., a rivet, is inserted into the inserting hole 4. Second, the end of the above rivet passes through the guide hole 5 and arrives at the staking hole 6. Third, both ends of the rivet are staked with the staking tool and then the other end 11 and the bent portion 7 are fastened together. In this case, after staking, one end of the rivet is prevented from protruding below the bent portion 7, i.e., inside the hollow case by the staking hole 6. Further, other rivets which have been prepared, corresponding to the length of the hollow case, are also successively fastened by the aforementioned procedures. Finally, the other end 11 and the bent portion 7 are connected together electrically and are also fastened together mechanically with all the rivets.

According to the above embodiment of the present invention, both ends of rivets can be staked individually with a staking tool of relatively small size. Therefore, even if the hollow case is relatively long, the other end 11 and the bent portion 7 can be fastened together by using a sufficiently large number of rivets, without a special size press. Thus, it is possible to fabricate the hollow case of any size, at the request of users. Further, because a staking tool is generally cheaper than a press, the cost of fabrication becomes lower.

Further, the fastening member 3 is also realized with at least one screw, instead of at least one staking unit. If a plurality of screws are required, they may be screwed individually with a screwdriver and the like. Thus, the other end 11 and the bent portion 7 can be also fastened together securely. In this case, it is necessary to form threaded holes in the other end 11 and the bent portion 7.

As explained above in detail, the present invention provides a hollow housing case having dimensions which can be freely selected. Therefore, it is possible to fabricate a hollow housing case of any size. Further, since it is unnecessary to use a relatively expensive press, the cost of fabrication becomes lower.

What is claimed is:

1. A hollow case for sheathing and electromagnetically shielding electric apparatus, comprising a sheet of electrically conducting plate which has one insulating surface outside and an opposite non-insulating surface inside, wherein said conducting plate is deformed into a hollow form;

said case including a connecting part which enables said non-insulating surfaces at both ends of said conducting plate to face and contact with each other, so that said non-insulating surfaces are in firm surface-to-surface contact;

wherein said connecting part is a bent portion which is formed at one end of said conducting plate and which has an innermost section and an outermost section, said one end being bent back outwardly such that said insulating surface is arranged inside said bent portion; and wherein the other end of said conducting plate is set on said bent portion such that it overlaps said outermost section and such that the non-insulating surfaces at both ends face and contact each other;

concentrically arranged holes formed in said bent portion and said other end where said non-insulating surfaces face and contact each other, said holes comprising an inserting hole formed in said other end, a guide hole formed in the outermost section of said bent portion, and a staking hole formed in the innermost section of said bent portion; and at least one fastening member contained within said holes and fastening said facing non-insulating surfaces together, one end of the fastening member having a portion bearing against the insulating surface of said other end of said conducting plate and the other end of the fastening member being contained in the staking hole without protrusion into said hollow form, and wherein the diameter of the inserting hole is not smaller than the diameter of the guide hole; the diameter of the guide hole is approximately the same as the diameter of the fastening member; and the diameter of the staking hole is larger than the end of the fastening member which is contained therein.

2. A hollow housing case as set forth in claim 1, wherein said fastening member is a staking unit.

3. A hollow housing case as set forth in claim 1, wherein said fastening member is a rivet or eyelet.

4. A hollow housing case as set forth in claim 1, wherein said fastening member is a screw.

* * * * *